United States Patent [19]
Burkhart et al.

[11] Patent Number: 5,745,332
[45] Date of Patent: Apr. 28, 1998

[54] MONOPOLAR ELECTROSTATIC CHUCK HAVING AN ELECTRODE IN CONTACT WITH A WORKPIECE

[75] Inventors: Vincent E. Burkhart, San Jose; Stefanie E. Harvey, Santa Clara, both of Calif.

[73] Assignee: Applied Materials, Inc., Santa Clara, Calif.

[21] Appl. No.: 639,842

[22] Filed: May 8, 1996

[51] Int. Cl.$^6$ ................................................. H02N 13/00
[52] U.S. Cl. ................................................. 361/234
[58] Field of Search ................................... 361/230, 233, 361/234; 279/128; 269/8, 903

[56] References Cited

U.S. PATENT DOCUMENTS

| | | | |
|---|---|---|---|
| 4,502,094 | 2/1985 | Lewin et al. | 361/234 |
| 4,554,611 | 11/1985 | Lewin | 361/234 |
| 4,665,463 | 5/1987 | Ward et al. | 361/234 |
| 4,897,171 | 1/1990 | Ohmi | 204/298 |
| 5,001,594 | 3/1991 | Bobbio | 361/234 |
| 5,656,093 | 8/1997 | Burkhart et al. | 279/128 |

FOREIGN PATENT DOCUMENTS

| | | | |
|---|---|---|---|
| 63-194345 | 8/1988 | Japan | H01L 21/68 |
| 2 050 064 | 12/1980 | United Kingdom | H02N 13/00 |

*Primary Examiner*—Fritz Fleming
*Attorney, Agent, or Firm*—Thomason & Moser

[57] ABSTRACT

A monopolar electrostatic chuck having a conductive pedestal base with a dielectric layer deposited thereupon. Upon the top surface of the dielectric layer is deposited a wafer spacing mask fabricated from a conduction material. The wafer spacing mask contains a plurality of support members that support a workpiece in a spaced apart relation with respect to said dielectric layer. At least one of said support members in said plurality of support members is adapted for connection to a power supply. The chucking voltage power supply is connected between the conductive pedestal base and the wafer support mask. In this manner, the workpiece is attracted to and thereby retained on the chuck without a plasma being generated proximate the wafer.

14 Claims, 1 Drawing Sheet

MONOPOLAR ELECTROSTATIC CHUCK HAVING AN ELECTRODE IN CONTACT WITH A WORKPIECE

BACKGROUND OF THE DISCLOSURE

1. Field of the Invention

The invention relates to a substrate support chuck for supporting a semiconductor wafer within a semiconductor processing system. More particularly, the invention relates to a monopolar electrostatic chuck having one electrode of the chuck contacting the supported wafer.

2. Description of the Background Art

Electrostatic chucks are used for holding a workpiece in various applications ranging from holding a sheet of paper in a computer graphics plotter to holding a semiconductor wafer within a semiconductor processing system. Although electrostatic chucks vary in design, they all are based on the principal of applying voltage to one or more electrodes in the chuck so as to induce opposite polarity charges in the workpiece and electrodes, respectively. The electrostatic attractive force between the opposite charges presses the workpiece against the chuck, thereby retaining the workpiece.

In semiconductor wafer processing equipment, electrostatic chucks are used for clamping wafers to a support pedestal during processing. The support pedestal may form an electrode as well as a heat sink or source. Such support pedestals are used in etching processes as well as chemical vapor deposition (CVD) or physical vapor deposition (PVD) applications.

More specifically, the electrostatic chuck contains a chuck body formed of a layer of dielectric material covering a conductive pedestal base. In a unipolar or monopolar electrostatic chuck, a voltage is applied to the conductive pedestal base relative to some internal chamber ground reference. The wafer is retained by coulomb force between charge accumulated on the underside of the wafer and the voltage applied to the pedestal base. A plasma generated proximate the chuck supplies a conductive path for the wafer to ground.

This form of monopolar electrostatic chuck requires a plasma to be developed within the chamber before the clamping voltage can be applied to the pedestal base. Consequently, there is a chance that the wafer could move from its position upon the chuck body prior to electrostatic clamping becoming effective. Also, in PVD processing, the wafer is typically heated prior to deposition processing, i.e., prior to generation of a plasma. Therefore, monopolar chucks do not find much use in PVD applications because the plasma necessary for chucking is not available until wafer processing is begun. It would be advantageous if a clamping force of a monopolar chuck could be effective prior to the plasma being developed within the process chamber.

Therefore, there is a need in the art for a monopolar electrostatic chuck that clamps the wafer without the presence of the plasma within the process chamber.

SUMMARY OF THE INVENTION

The disadvantages heretofore associated with the prior art are overcome by an inventive monopolar chuck for chucking workpieces without the presence of a plasma. More specifically, the invention is a monopolar chuck having chuck body formed of a conductive pedestal base with a dielectric layer deposited thereupon. Upon the wafer support surface of the dielectric layer is deposited a wafer spacing mask fabricated from a conductive material. Such wafer spacing mask fabrication materials include metals such as titanium, titanium nitride, stainless steel, and the like.

One example of a chuck body used in a physical vapor deposition (PVD) system has as the conductive pedestal base a conventional heater assembly. The heater assembly housing and surface that underlies the wafer is typically fabricated from stainless steel. However, in other systems, where a heater is not used, the pedestal base may simply be a cylindrical block of aluminum or stainless steel. The dielectric layer is deposited uniformly over the entire surface of the pedestal base to insulate the base from the wafer. The wafer spacing mask, comprising a plurality of support members, is deposited atop the dielectric layer. The support members of the wafer spacing mask maintain the wafer, or other workpiece, in a spaced-apart relation relative to the support surface of the dielectric layer. The distance between the underside surface of the wafer and the surface of the dielectric layer is defined by the thickness of the support members.

A power supply is connected between the conductive pedestal base and at least one of the support members of the wafer support mask. As such, a very intense electric field is generated across the dielectric layer between the wafer and the conductive pedestal base. The potential produced on the wafer is different, and typically oppositely polarized, from the potential that is applied to the pedestal base. As such the charge on the underside of the wafer is attracted via Coulomb force to the charge on the conductive pedestal base such that the wafer is attracted to and thereby retained (clamped) on the chuck. Such retention is accomplished without the plasma being generated proximate the chuck and the wafer.

In a specific embodiment of the invention, the wafer spacing mask is fabricated by depositing, for example, using a physical vapor deposition (PVD) process, a pattern of metallic support members upon the dielectric layer of the chuck body. The dielectric layer is also applied to the pedestal base, using a PVD process. Both the dielectric layer and the spacing mask may also be deposited using chemical vapor deposition (CVD), plasma spray deposition, brazing, flame spray deposition, and the like. The support members of the spacing mask are deposited in a predefined pattern such as a plurality of spaced apart pads. At least one pad is connected to the power supply. More typically, a plurality of selected metal pads within the spacing mask are connected via conductive traces to one terminal of a high voltage power supply. The other terminal power supply is connected to the conductive pedestal base.

As a result of using the invention during processing of semiconductor wafers, a wafer can be positioned and retained upon the chuck prior to the generation of the plasma within the reaction chamber.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
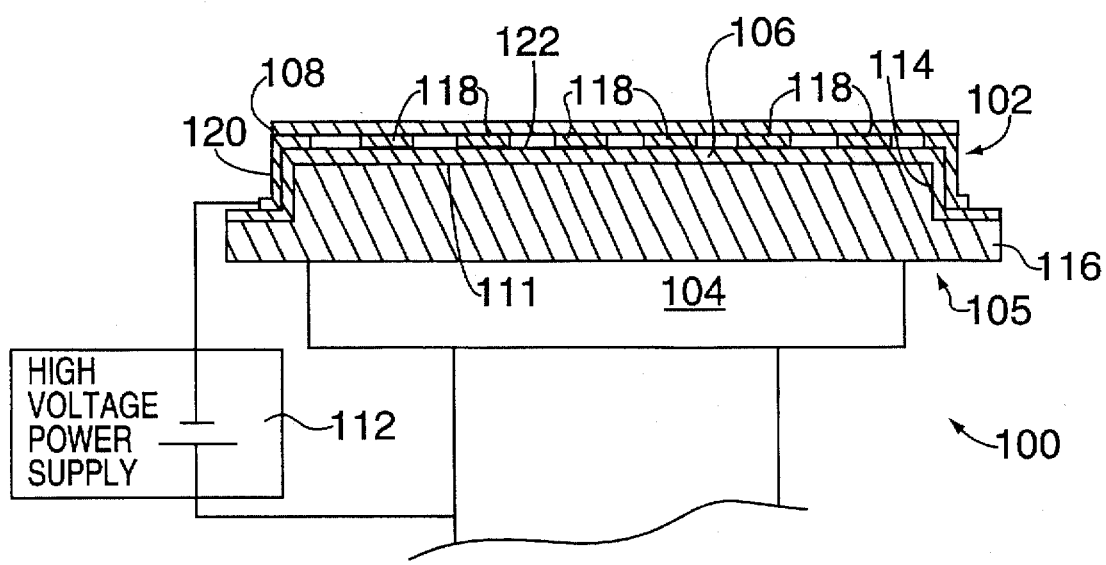
FIG. 1 depicts a vertical cross-section of a monopolar electrostatic chuck in accordance with the present invention.
Figure 2:
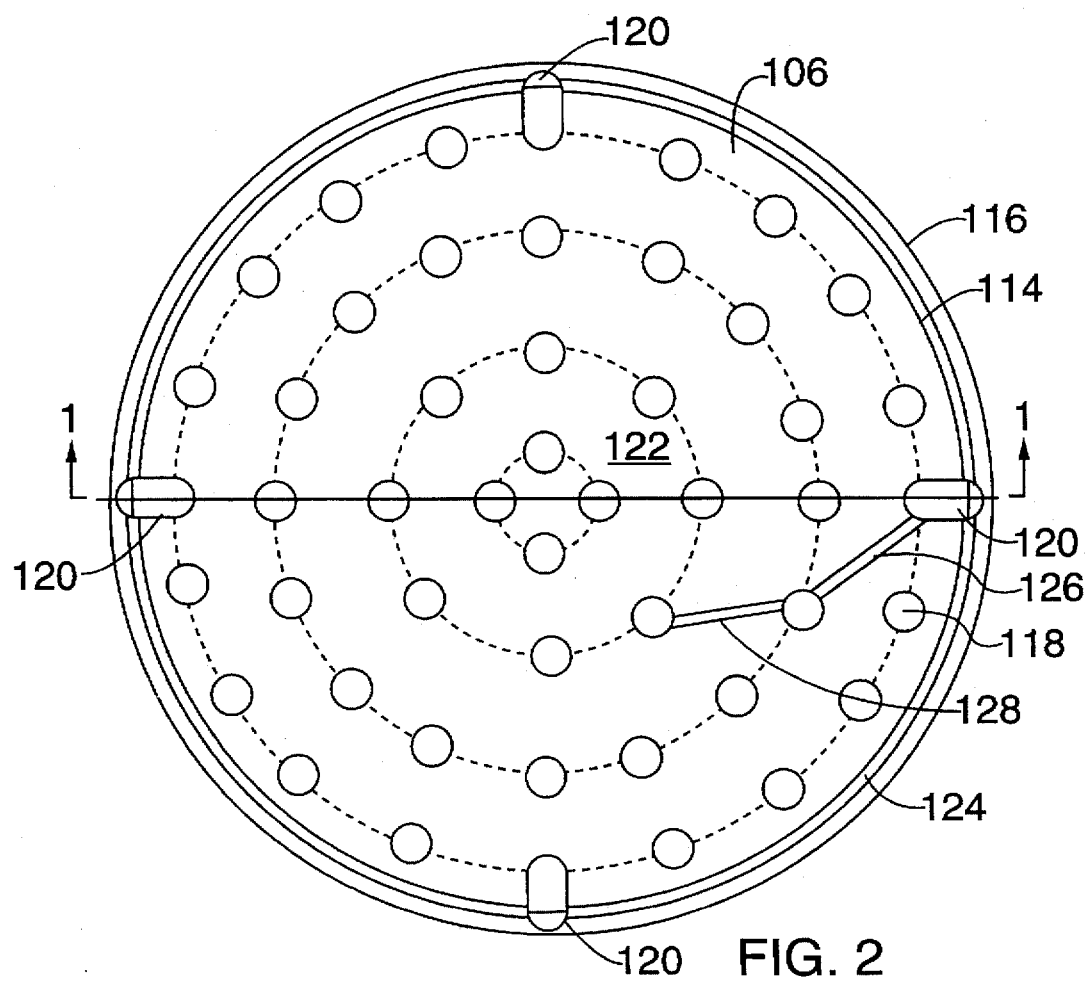
FIG. 2 depicts the top plan view of an illustrative pattern for the wafer spacing mask.

FIG. 1 depicts a vertical cross-sectional view of a monopolar electrostatic chuck 100 in accordance with the present invention. To illustrate the use of the invention, FIG. 1 depicts a spacing mask 102 supporting a semiconductor wafer 108. FIG. 2 depicts a top plan view of the wafer spacing mask 102 of FIG. 1 (without the wafer 108). For best understanding of the invention, the reader should refer to both FIGS. 1 and 2 while reading the following disclosure.

In the preferred embodiment, the monopolar electrostatic chuck 100 contains a chuck body 105 formed of a conductive pedestal base 104 and a dielectric layer 106 deposited thereupon. The conductive pedestal base is typically a conventional heater assembly for a physical vapor deposition (PVD) system. Such a heater assembly is disclosed in commonly assigned U.S. patent application Ser. No. 08/567,625, filed Dec. 15, 1995 and herein incorporated by reference. However, the pedestal base could simply be a cylindrical block of stainless steel or aluminum.

Upon the top surface 111 of the pedestal base 104 is deposited a dielectric layer 106 having a thickness of between 5 and 200 micrometers. The dielectric layer (or film) can be deposited in a conventional manner such as by sputtering, chemical vapor deposition (CVD), plasma enhanced CVD (PE-CVD), and the like. The film can be fabricated from one of a number of dielectric materials such as alumina, diamond, doped silicon, or a glass material. The film covers the entire upper surface of the pedestal base as well as its side walls 114 and the top surface of flange 116.

The wafer spacing mask 102 is typically deposited using a PVD method. However, other metal coating methods are available and can be used to deposit the metallic material in a pre-defined pattern. These spacing masks can be manufactured from any one of a variety of conductors such as titanium, stainless steel, nickel and polysilicon. The spacing mask materials deposited to a pre-defined thickness that maintains the wafer 108, or other workpiece, of the support surface of the dielectric layer. Illustrative thickness is approximately 2 microns. A wafer support mask is disclosed in commonly assigned U.S. patent application Ser. No. 08/612,652 filed Mar. 8, 1996 and incorporated herein by reference.

FIG. 2 depicts an illustrative mask pattern having its support members formed as a plurality of spaced apart pads 118—118 of deposited metallic material. Each pad has a diameter of approximately 0.25 cm (0.1 inches). The concentric rings shown as dashed lines are spaced apart by 0.64 cm (0.25 inches) and the pads within each ring are spaced from one another at approximately 0.64 cm (0.25 inches). Generally speaking, the number, spacing and size of the pads is determined by the amount of clamping that is applied by the electrostatic chuck. For example if the amount of force is large and the pads are spaced relatively distant from one another, the wafer may bow between the pads. On the other hand, placing too many pads on the surface of the chuck could interfere with the electrostatic fields that facilitate the clamping force by coupling to the underside of the dielectric wafer. Therefore, the pads must be judiciously positioned to optimize support, yet limit their interference with the clamping force. Of course, other patterns for the support members can be used including concentric rings, radials or a combination of concentric rings and radials.

To facilitate connection of a chucking voltage to the wafer, at least one support member 120 is connected to a voltage supply 112. Generally speaking, to achieve reliable connection to the underside of the wafer, a plurality of support members 120—120 (e.g., four) are connected to one terminal of the voltage supply 112. The conductive connection from the support members 120—120 to the power supply 112 can be accomplished in many ways. The embodiment shown contains four "biased" support members 120—120 that are evenly distributed about the circumference of the chuck body support surface 122. However, to ensure that a connection is made to the wafer, even when a wafer is severely warped, many biased support members (e.g., nine) can be used. Additionally, support members located at inner locations on the chuck body can be interconnected by optional interconnection traces such as traces 126 and 128.

The biased support members located at the edge of the chuck body are oval in plan form and "overhang" the support surface 122 of the chuck body. As such, during deposition of the spacing mask, these support members are formed along the support surface 122, the sidewall 114, and flange 116 of the chuck body 105. Furthermore, during deposition of the support members, an interconnection trace 124 is formed to interconnect all of the biased support members 120—120. Specifically, the interconnection trace 124 is formed upon the flange 116 and circumscribes the entire chuck body. To bias the support members 120 the interconnection trace 124 is connected to a conductive wire that is, in turn, connected to one terminal of the high voltage power supply 112. The other terminal of the high voltage supply 112 is connected to the conductive pedestal base 104. As such, a high voltage is applied across the dielectric layer 106. To effectively clamp a 200 mm diameter wafer without the presence of a plasma, the applied voltage has an approximate magnitude of 300 volts DC.

Application of the chucking voltage to the pedestal base and wafer spacing mask produces a charge distribution along the underside of the wafer and over the surface of the pedestal base. The opposite polarity of these charges produces an attractive electrostatic force between the wafer and the pedestal base. This force retains the wafer upon the chuck without relying upon a plasma within the process chamber to provide a conductive grounding path for the wafer. Consequently, in a PVD process, the wafer can be electrostatically chucked and heated prior to the plasma being generated.

Although various embodiments which incorporate the teachings of the present invention have been shown and described in detail herein, those skilled in the art can readily devise many other varied embodiments that still incorporate these teachings.

What is claimed is:

1. A monopolar electrostatic chuck for retaining a workpiece comprising:

a chuck body having a surface;

a wafer spacing mask of conductive material deposited upon said surface of said chuck body, where said wafer spacing mask further comprises a plurality of individual support members for supporting said workpiece in a spaced apart relation with respect to said surface of said chuck body and where at least one of said individual support members is adapted for connection to a power supply.

2. The monopolar electrostatic chuck of claim 1 wherein said chuck body further comprises:

a conductive wafer pedestal base having a pedestal surface; and a dielectric layer deposited upon said surface of said conductive pedestal base and forming said surface of said chuck body.

3. The monopolar electrostatic chuck of claim 2 wherein said at least one of said individual support members that is adapted for connection to the power supply is positioned proximate an edge of said chuck body.

4. The monopolar chuck of claim 3 wherein said at least one of said individual support members that is adapted for connection to the power supply comprise a subset of said plurality of support members.

5. The monopolar electrostatic chuck of claim 4 wherein each of said individual support members in said subset of support members is located proximate an edge of said chuck body and overhangs the edge, where a first portion of each of said support members in said subset contacts said workpiece and a second portion of each of said support members in said subset receives a connection to the power supply.

6. The monopolar electrostatic chick of claim 5 wherein each of said support members in said subset of support members is interconnected by an interconnection trace.

7. The monopolar electrostatic chuck of claim 3 further comprising an interconnection trace that connects said at least one of said individual support members that is adapted for connection to the power supply to at least one other support member.

8. Apparatus for retaining a workpiece comprising:

a chuck body having a surface;

a wafer spacing mask of conductive material deposited upon said surface of said chuck body, where said wafer spacing mask further comprises a plurality of individual support members for supporting said workpiece in a spaced apart relation with respect to said surface of said chuck body; and a power supply having a first terminal connected to said chuck body and a second terminal connected to said wafer spacing mask.

9. The apparatus of claim 8 wherein said chuck body further comprises:

a conductive wafer pedestal base having a pedestal surface; and a dielectric layer deposited upon said surface of said conductive pedestal base and forming said surface of said chuck body.

10. The apparatus of claim 9 wherein at least one of said individual support members is connected to said power supply and is positioned proximate an edge of said chuck body.

11. The apparatus of claim 10 wherein said at least one of said individual support members that is connected to the power supply comprise a subset of said plurality of support members.

12. The apparatus of claim 11 wherein each of said individual support members in said subset of support members is located proximate an edge of said chuck body and overhangs the edge, where a first portion of each of said support members in said subset contacts said workpiece and a second portion of each of said support members in said subset is connected to said power supply.

13. The apparatus of claim 12 wherein each of said support members in said subset of support members is interconnected by an interconnection trace.

14. The apparatus of claim 9 further comprising an interconnected trace that connects said at least one of said individual support members that is connected to said power supply to at least one other support member.

* * * * *